United States Patent

Dingwall

[15] 3,644,802

[45] Feb. 22, 1972

[54] RATIO-COMPENSATED RESISTORS FOR INTEGRATED CIRCUIT

[72] Inventor: Andrew G. F. Dingwall, Somerville, N.J.

[73] Assignee: RCA Corporation

[22] Filed: May 31, 1968

[21] Appl. No.: 733,374

[52] U.S. Cl. ....................317/235 R
[51] Int. Cl. ....................H01l 11/00
[58] Field of Search ....................317/235, 101 A

[56] References Cited

UNITED STATES PATENTS 3,416,957 12/1968 Pechini ....................317/235

*Primary Examiner*—Richard A. Farley
*Assistant Examiner*—H. A. Birmiel
*Attorney*—Glenn H. Bruestle

[57] ABSTRACT

The ratio of the resistances of two diffused integrated circuit resistors of dissimilar geometries is made relatively insensitive to processing variations in the structure of the resistors in different devices. Wider resistors in a given device are made more sensitive to width variations to match the greater sensitivity of narrower resistors in that device, and longer resistors are made more sensitive to length variations to match the greater sensitivity of shorter resistors. Lower value resistors are made less sensitive to metallurgical phenomena that affect contact resistance so that proportionally less contact resistance change is produced by a given processing variation in the lower value resistors than in the higher value resistors.

10 Claims, 6 Drawing Figures

INVENTOR
ANDREW G. F. DINGWALL

BY Robert P. Williams
ATTORNEY

INVENTOR
ANDREW G. F. DINGWALL

BY Robert O. Williams
ATTORNEY

RATIO-COMPENSATED RESISTORS FOR INTEGRATED CIRCUIT

BACKGROUND OF THE INVENTION

The invention herein described was made in the course of or under a contract or subcontract thereunder with the Department of the Air Force. The invention relates to semiconductor integrated circuit devices of the monolithic type and pertains more particularly to resistors for such devices.

Conventional monolithic integrated circuit devices include a substrate of semiconductive material, such as monocrystalline silicon, for example. Active and passive components are formed in the substrate and are interconnected by conductors deposited on an insulating coating on the surface of the substrate. Resistors for such circuits are usually made as diffused regions in the substrate adjacent to the surface thereof. These regions are either of conductivity type opposite to that of the substrate or of the same conductivity type as the substrate but isolated therefrom, as by a separation region of opposite type conductivity. Metal contacts, which may be portions of the interconnection conductors, are applied at spaced locations on the surface of each diffused region to connect each resistor to other components in the circuit.

The shape of the area of the substrate surface which is occupied by a diffused resistor region is usually rectilinear, with a predetermined width. The resistance value of a diffused resistor is a function of the impurity profile in the diffused region, the depth of the diffusion, and the length-to-width ratio of the resistor. In a conventional planar structure, the length factor in the length-to-width ratio is a function of the spacing between the nearer edges of the metal contacts rather than of the length of the diffused region on the surface of the substrate. The diffusion depth is ordinarily small, for example of the order of 3 micrometers and is relatively constant throughout the region. For this reason, the resistance value is generally stated as the product of the sheet resistance of the material, given in units of ohms per square, and the length-to-width ratio of the resistor.

Because the area of the diffused region which is contacted by the metal interconnection conductors must be wholly within the diffused area, so that shorting of the region to the substrate does not occur, and because there is contact resistance between the metal and the semiconductive material, there is additional resistance in the contact area. This additional resistance is usually accounted for as an increase in the effective length of the diffused region, i.e., as the sum of a nominal length and a correction factor, where the nominal length is the spacing between the nearer edges of the contacts.

The diffused resistor regions in silicon integrated circuit devices are conventionally formed by photoetching processes, generally as follows. First, a coating of silicon dioxide is formed on the surface of the substrate. A photoresist mask is then formed on the surface of the silicon dioxide coating in the desired resistor shape and the silicon dioxide coating is etched away in the areas determined by the photoresist pattern to expose the surface of the substrate. Dopant impurities (boron in the case of a P-type region in an N-type substrate, for example) are then caused to diffuse into the substrate to form the resistor region. A new silicon dioxide coating is formed over the diffused surface and contact openings are produced therein by the photoetching process. Finally, metallization is deposited on the surface with portions thereof extending into the openings to contact the resistor region.

In the application of these processing steps to a plurality of substrates in a manufacturing operation, structural and metallurgical differences may occur between one substrate and another and between different areas on the same substrate. For example, in the photoetching steps, the photoresist material may have differences in photosensitivity or the degree of exposure may differ, such that larger or smaller photoresist patterns will result. The thickness of the silicon dioxide coating may vary from place to place with the result that etched openings which are intended to be of the same size will in fact be different. The time employed for the diffusion step may vary so that greater or less side diffusion takes place and greater or less sheet resistivity results. Contact resistance may also vary from intended values because of size differences in the contact openings or metallurgical phenomena in the contact metallization. Thus, the size, resistivity, and contact resistance of diffused resistors all tend to vary randomly throughout a processing batch. In standard practice, it is difficult to hold the absolute value of a diffused resistor to within ± 10 percent.

A large improvement in tolerance is provided by using resistors in pairs where the ratio between the resistors, rather than the absolute values thereof, is of circuit significance. Typical applications include the use of resistors as voltage dividers to establish biasing or feedback voltages, for example. Processing variations may be presumed to produce similar dimensional changes and similar resistivity changes in adjacent resistors on a particular substrate. Where the resistors have similar shapes, the processing variations will affect the length-to-width ratios and the contact resistance factors of the resistors in substantially the same manner so that the ratio between the resistors is quite accurately maintained. Resistance ratios between similar resistors can usually be held to within ±2 percent.

The foregoing considerations do not apply for adjacent resistors which have different shapes because such resistors will be affected differently by the same process variations and consequently, the statistical spread in the ratio between them will be substantially greater than in the case of similar resistors.

SUMMARY OF THE INVENTION

The present diffused resistors are intended to be used in pairs in circuit applications where the ratio between their values is of circuit significance. The resistors include means for making them relatively equally sensitive to processing variations, regardless of differences in their shapes, so that the ratio between them is held within tolerances closer than have been achieved heretofore. For example, where one resistor has a lower value by being wider than another resistor, in which case the wider resistor would be less affected by a width variation of a given amount, means may be provided in the wider resistor to increase the effect of this variation to a level substantially equal to that of the narrower resistor. Similarly, means may be included in a longer, higher valued resistor to increase its sensitivity to processing variations which affect the length of the resistors to a level substantially equal to that of a shorter resistor. The effects of metallurgical variations in contact resistance may be diluted in lower value resistors so that proportionately less contact resistance change occurs in such low-value resistors than occurs in relatively higher value resistors.

THE DRAWINGS

THE PREFERRED EMBODIMENTS

Figure 1:
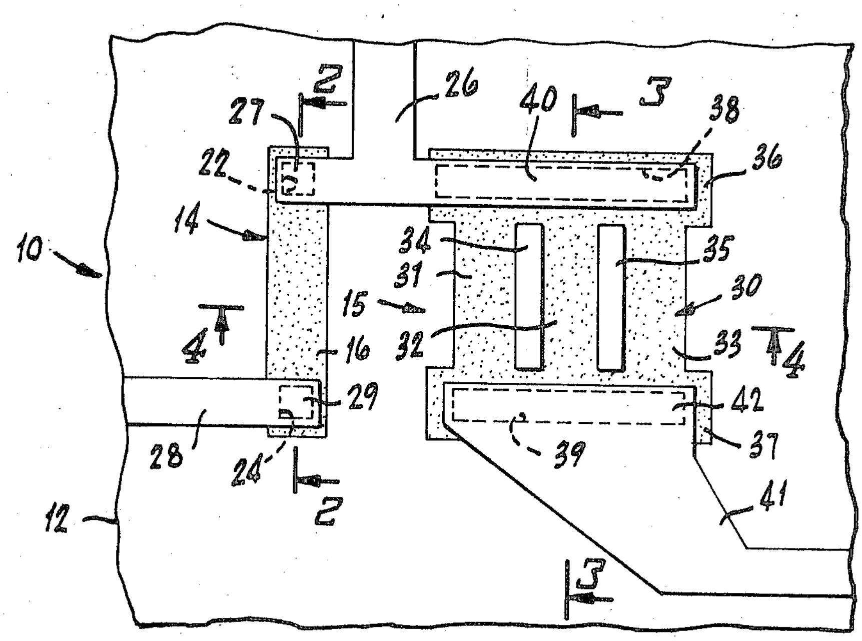
FIG. 1 is a plan view of a portion of an integrated circuit showing two resistors with a ratio of about 3 to 1 between their resistances.

One embodiment of the present ratio-compensated resistor pairs is illustrated in FIG. 1 as part of an integrated circuit device 10 which is formed in a body 12 of monocrystalline semiconductive material, preferably silicon. The integrated circuit device 10 includes a first resistor 14 and a second resistor 15, which has a relatively lower value than the first resistor 14. In this example, the resistor 15 has a resistance about one-third that of the resistor 14. The resistors 14 and 15 are made by conventional photoetching processes as outlined above.

The resistor 14 includes a diffused region 16 within the semiconductive body 12 adjacent to a surface 18 thereof. See FIG. 2. The area occupied by the diffused region 16 on the surface 18 is stippled in FIG. 1 and is rectangular, as shown.

Figure 2:
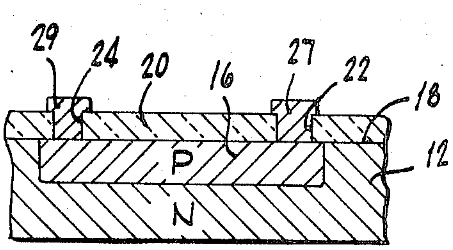
FIG. 2 is a cross section taken on the line 2—2 of FIG. 1.
Figure 3:
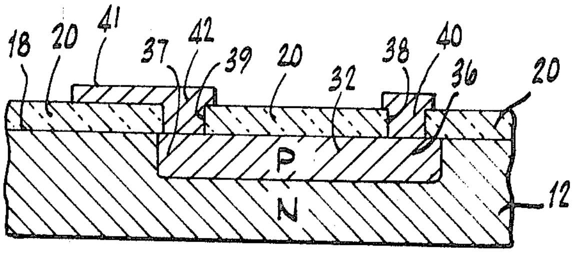
FIG. 3 is a cross section taken on the line 3—3 of FIG. 1.
Figure 4:
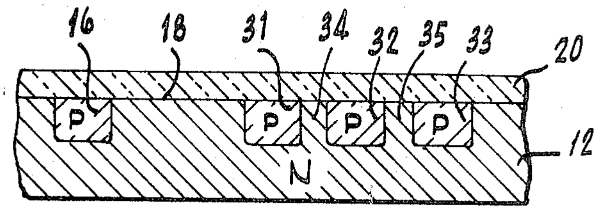
FIG. 4 is a cross section taken on the line 4—4 of FIG. 1.

An insulating coating 20, FIG. 2, of silicon dioxide for example, is disposed on the surface 18 of the body 12. Openings 22 and 24, shown in dotted lines in FIG. 1, are provided in the insulating coating 20 at spaced locations over the region 16. A conductor 26 has a portion 27 extending into the opening 22 to make contact to the region 16 near one end thereof and a conductor 28 has a portion 29 extending into the opening 24 to make contact to the region 16 near the opposite end thereof.

The resistance of the resistor 14 is a function of the effective length-to-width ratio thereof, and of the sheet resistance of the region 16. The effective width is simply the width of the region 16. The effective length is the sum of the separation distance between the nearer edges of the openings 22 and 24 and a correction factor (empirically determined) to account for contact resistance and for the fact that the contacts do not extend completely across the width of the region.

The resistor 15 includes a diffused region 30 which has a surface configuration which is also differentiated by stippling in FIG. 1. More particularly, the region 30 has a plurality of elongated spaced parallel strip portions 31, 32, and 33 which are separated by elongated nondiffused regions 34 and 35. Each of the strip portions 31, 32 and 33 has a width about the same as the width of the region 16 of the resistor 14. The strip portions 31, 32, and 33 should be spaced just far enough apart that their edges will not come into contact when a maximum positive error occurs in their width. The region 30 also has a pair of enlarged contact regions 36 and 37 which extend across the respective ends of the strip portions 31, 32 and 33 and which join the portions 31, 32 and 33 in electrical parallel.

The insulating coating 20 also extends over the region 30. Adjacent to the contact regions 36 and 37, the insulating coating 20 has enlarged openings 38 and 39. A portion 40 of the conductor 26 extends into the opening 38 to engage the one contact region 36. Another conductor 41 has a portion 42 extending into the opening 39 to engage the other contact region 37.

The separation distance between the nearer edges of the openings 38 and 39 in the resistor 15 is about the same as the distance between the nearer edges of the openings 22 and 24 in the resistor 14. The resistance value of the resistor 15 can be considered as the resistance of three resistors in parallel, each of these three resistors having a sheet resistance and a length-to-width ratio about the same as that of the resistor 14 and therefore a resistance substantially equal to that of the resistor 14. Consequently, the resistance of the resistor 15 is about one-third that of the resistor 14.

In conventional resistors, in which a lower value resistor may simply be wider than a higher value resistor, a processing variation which affects the width of each resistor in the same way will effectively add or subtract to each a resistance in parallel of the same amount. Because the combined resistance of a set of resistors in parallel is a function of the sum of the reciprocals of the resistances thereof, it follows that a proportionately greater change in resistance occurs in a higher valued resistor than occurs in a lower valued resistor when the same resistance is added to each in parallel. In other words, a conventional wider, lower valued resistor is less sensitive to width variations than a narrower, higher valued resistor.

In the present resistors, a processing difference which affects the width of the resistor 14, for example, will affect the width of each of the strip portions 31, 32 and 33 by about the same amount because they have about the same width as the resistor 14. Electrically, the change of each of the portions 31, 32 and 33 by the same amount results in a composite change in the resistance of the resistor 15 exactly one-third as great as that of the resistor 14 because of the connection of the portions 31, 32 and 33 in parallel. Accordingly, the ratio between the resistors 14 and 15 in several devices in a processing batch be held within closer tolerances than have been achieved heretofore. In general, the configuration of the resistor 15 as a plurality of separate strip portions connected in parallel makes it about equally as sensitive to processing variations which affect the width of the resistor regions as the narrower resistor 14.

The enlarged contact areas in the resistor 15 serve to dilute the effects of metallurgical differences in the contacts between the conductor contact portions 27, 29, 40 and 42 and the semiconductive material. Each contact contributes a resistance in series with that of the semiconductive region, and the magnitude of this resistance is inversely proportional to the area of contact between the metal and the semiconductor. In the resistor 15, the area of contact is much larger than the area of contact in the resistor 14, and as a result, a proportionately smaller change in resistance in series with the resistor will occur. The ratio between the resistors is therefore relatively unaffected by contact resistance variations.

Figure 5:
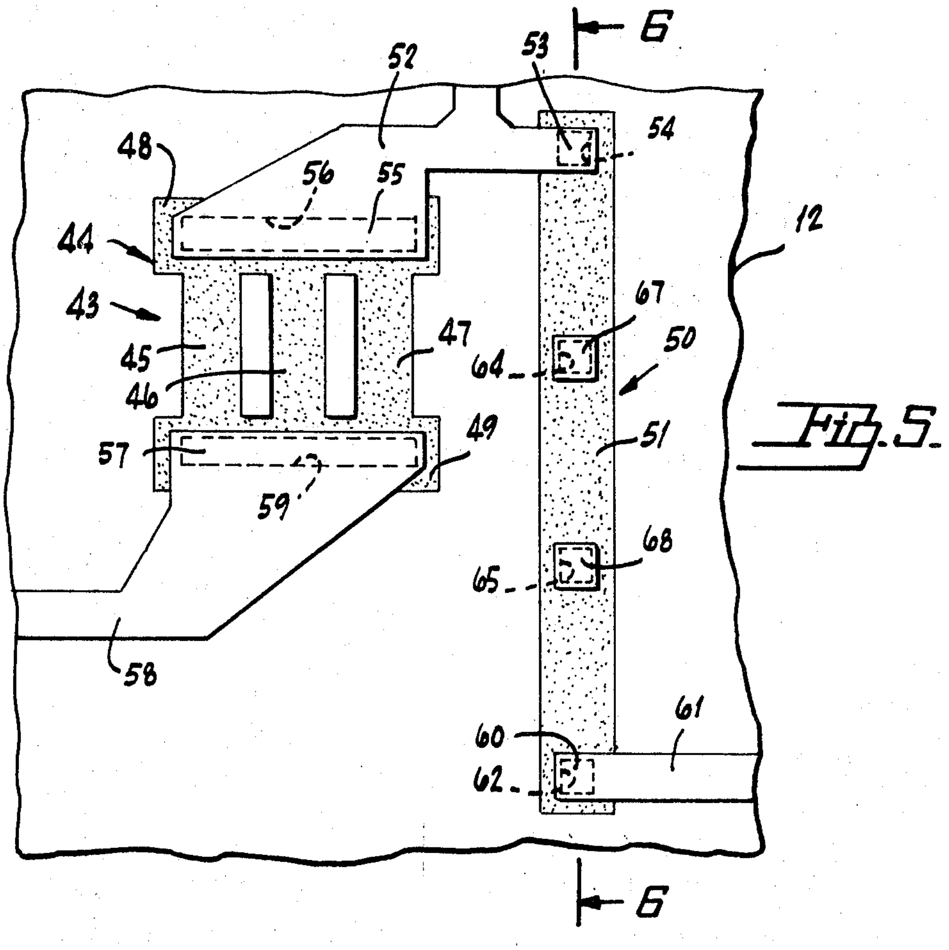
FIG. 5 is a plan view of a portion of an integrated circuit showing another two resistors with a ratio of about 9 to 1 between their resistances.
Figure 6:
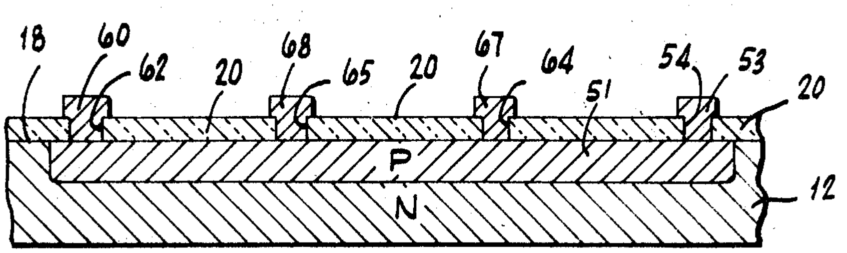
FIG. 6 is a cross section taken on the line 6—6 of FIG. 5.

FIG. 5 illustrates another embodiment of the present resistor pairs in which a greater ratio is present between the resistances of the two resistors. The resistors in this embodiment are formed, like the resistors 14 and 15, in a semiconductive substrate 12 adjacent to a surface 18 thereof. A coating of insulating material 20 is disposed on the surface 18, as in the FIG. 1 embodiment.

In this embodiment, there is a resistor 43, which includes a diffused region 44 formed in the substrate 12. The resistor 43 has the same configuration as the resistor 15 and includes elongated parallel strip portions designated by the numerals 45, 46 and 47 and enlarged contact regions 48 and 49 joining the strip portions 45, 46 and 47 in parallel. The other resistor 50, includes a diffused rectangular region 51. A conductor 52 has a portion 53 extending through an opening 54 in the insulating coating 20 to make contact with the region 51 of the resistor 50 near one end thereof. The conductor 52 also has an enlarged portion 55 extending through an opening 56 in the coating 20 to engage the contact region 48 of the resistor 43. An enlarged contact portion 57 of a conductor 58 engages the other contact region 49 of the resistor 43 through an opening 59 in the coating 20, and a contact portion 60 of a conductor 61 engages the opposite end of the region 51 of the other resistor 50 through an opening 62 in the coating 20.

The width of the region 51 is about the same as the width of the several strip portions 45, 46 and 47 of the region 44 so that there is about a 3 to 1 ratio between the resistances of these resistors which is attributable to the connection of the strip portions 45, 46 and 47 in parallel. Moreover, the spacing between the nearer edges of the contact openings 54 and 62 in the resistor 50 is about three times the distance between the openings 56 and 59 in the resistor 43, which introduces a second 3 to 1 relationship between these two resistors. Consequently, there is a ratio of about 9 to 1 between the resistances of the resistors 50 and 43, respectively.

A processing variation which affects the width of the regions 51, 45, 46 and 47 will be compensated for in the same way as in the embodiment of FIG. 1. However, because the spacing between the contacts in the resistor 50 is much greater than the contact spacing in the resistor 43, the resistor 50, if conventionally constructed, would be less sensitive than the resistor 43 to processing variations which affect the spacing between the contacts. These variations may be, for example, differences in the size or location of the contact openings 54 and 62. To compensate for this phenomenon, means are provided in the resistor 50 to make it more sensitive to such contact opening variations. For this purpose, auxiliary contact openings, indicated at 64 and 65, for example, are provided in the insulating layer 20 over the region 51 at locations between the contact openings 54 and 62, and auxiliary metal contacts 67 and 68 are disposed in the openings 64 and 65, respectively. This has the effect of dividing the resistor 50 into three resistors connected in series, in this example. Any variation in the contact openings 54 and 62 will also occur in the openings 64 and 65, so that the change in the effective length of the resistor 50 will be magnified, as compared to a similar resistor without auxiliary contact openings to a level comparable to that which occurs in the resistor 43. The number of auxiliary contact openings and their sizes may be empirically determined for a given resistor so that the change in contact spacing in the longer resistor will be proportionately the same as that in the shorter resistor of the pair.

By utilizing the compensation for width variations which is provided by the separation of the lower value resistor into parallel strips, the contact separation compensation provided by the auxiliary contact openings in the longer of two resistors, and the contact resistance compensation provided by the enlarged contact openings in a lower value resistor, substantial improvements in the tolerance limits of the resistance ratio between resistor pairs is achieved.

I claim:

1. An integrated circuit device formed in a substrate of semiconductive material having a surface, said circuit including two resistors comprising a pair of adjacent diffused regions in said substrate adjacent to said surface and contact means engaging each of said regions at spaced locations thereon, one of said regions having a predetermined width, the other of said regions including a plurality of separate strip portions extending and effectively connected in parallel between its associated contact means, each of said strip portions having a width approximately the same as that of said one region.

2. An integrated circuit device as defined in claim 1 wherein said other region also includes enlarged diffused portions under its contact means, said enlarged portions joining the respective ends of said strips.

3. An integrated circuit device as defined in claim 1 wherein the spacing between the contact means on said one region is substantially the same as the spacing between the contact means on said other region.

4. An integrated circuit device as defined in claim 1 wherein the spacing between the contact means on said region is substantially greater than the spacing between the contact means on said other region, said device further comprising conductive means contacting said one region over at least one distinct area thereof located between the locations of its contact means.

5. An integrated circuit device including at least two resistors, the ratio between the values of which is of circuit significance, said device comprising a substrate of semiconductive material having a surface, said resistors comprising a pair of adjacent diffused regions in said substrate adjacent to said surface, one of said regions having a rectangular shape with a predetermined width, the other of said regions comprising a plurality of elongated parallel strip portions, each having a width substantially equal to the width of said one region and an enlarged portion at each of the respective ends of said strip portions extending across said ends and joining said strip portions in electrical parallel relation, a first pair of conductive means contacting said one region at areas near each end thereof, and a second pair of conductive means each contacting one of said enlarged portions of said other region over an area of contact substantially greater than the area of contact of each of said first pair of conductive means with said one region.

6. An integrated circuit device as defined in claim 5 wherein the spacing between the contact areas of said first pair of conductive means is substantially the same as the spacing between the contact areas of said second pair of conductive means.

7. An integrated circuit device as defined in claim 5 wherein the spacing between the contact areas of said first pair of conductive means is substantially greater than the spacing between the contact areas of said second pair of conductive means, said device further comprising auxiliary conductive means contacting said one region over at least one distinct area thereof located between the contact areas of said first pair of conductive means.

8. An integrated circuit device comprising a body of semiconductive material having a surface, a first rectilinear diffused region in said body adjacent to said surface, said first diffused region having a predetermined width, first spaced contact means engaging said first diffused region to define a first resistor having a predetermined length-to-width ratio, a second diffused region in said body adjacent to said surface and to said first diffused region, second spaced contact means engaging said second diffused region to define a second resistor having a length to width ratio different from that of said first resistor, said second diffused region having elongated nondiffused regions therewithin extending parallel to the length thereof and effectively dividing said second diffused region into a plurality of strip portions, each of said strip portions having a width approximately equal to that of said first diffused region.

9. An integrated circuit device as defined in claim 8 wherein said elongated nondiffused regions terminate short of the respective ends of said second diffused region whereby end portions of said second diffused region extend across and join said strip portions in electrical parallel, said second spaced contact means engaging said end portions over an area thereof which is large compared to the area of contact of said first spaced contact means to said first diffused region.

10. An integrated circuit device as defined in claim 9 wherein the spacing between said first spaced contact means is substantially greater than the spacing between said second spaced contact means, said device further comprising at least one conductive means contacting said first diffused region in at least one area thereof between its spaced contact means.

* * * * *

Disclaimer 3,644,802.—*Andrew G. F. Dingwall*, Somerville, N.J. RATIO-COMPENSATED RESISTORS FOR INTEGRATED CIRCUIT. Patent dated Feb. 22, 1972. Disclaimer filed Oct. 24, 1972, by the assignee, *RCA Corporation.*

Hereby disclaims the entire remaining term of said patent.

[*Official Gazette January 16, 1973.*]